United States Patent
Otagiri et al.

(10) Patent No.: US 11,965,059 B2
(45) Date of Patent: *Apr. 23, 2024

(54) CHEMICAL-RESISTANT PROTECTIVE FILM FORMING COMPOSITION CONTAINING HYDROXYARYL-TERMINATED POLYMER

(71) Applicant: NISSAN CHEMICAL CORPORATION, Tokyo (JP)

(72) Inventors: Shigetaka Otagiri, Toyama (JP); Tokio Nishita, Toyama (JP); Takafumi Endo, Toyama (JP); Yuki Endo, Toyama (JP); Takahiro Kishioka, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 178 days.

This patent is subject to a terminal disclaimer.

(21) Appl. No.: 17/601,674

(22) PCT Filed: Apr. 9, 2020

(86) PCT No.: PCT/JP2020/015948
§ 371 (c)(1),
(2) Date: Oct. 5, 2021

(87) PCT Pub. No.: WO2020/209327
PCT Pub. Date: Oct. 15, 2020

(65) Prior Publication Data
US 2022/0204686 A1    Jun. 30, 2022

(30) Foreign Application Priority Data

Apr. 11, 2019  (JP) ................... 2019-075867

(51) Int. Cl.
| | |
|---|---|
| C08G 59/14 | (2006.01) |
| C08G 59/16 | (2006.01) |
| C08G 59/26 | (2006.01) |
| C08G 59/62 | (2006.01) |
| C08G 59/68 | (2006.01) |
| C09D 163/00 | (2006.01) |
| C09D 163/10 | (2006.01) |
| G03F 7/11 | (2006.01) |
| H01L 21/02 | (2006.01) |
| H01L 21/027 | (2006.01) |
| H01L 21/033 | (2006.01) |
| H01L 21/67 | (2006.01) |

(52) U.S. Cl.
CPC ..... *C08G 59/1483* (2013.01); *C08G 59/1455* (2013.01); *C08G 59/26* (2013.01); *C08G 59/621* (2013.01); *C08G 59/68* (2013.01); *H01L 21/027* (2013.01); *H01L 21/67075* (2013.01)

(58) Field of Classification Search
None
See application file for complete search history.

(56) References Cited

U.S. PATENT DOCUMENTS

| | | | | |
|---|---|---|---|---|
| 2011/0059404 A1* | 3/2011 | Sakamoto | ............ | C08G 63/20 |
| | | | | 252/582 |
| 2014/0004465 A1* | 1/2014 | Ohnishi | ............ | C08G 59/4223 |
| | | | | 430/296 |
| 2016/0336189 A1 | 11/2016 | Kori et al. | | |
| 2020/0183282 A1* | 6/2020 | Hashimoto | ........ | C09D 133/068 |

FOREIGN PATENT DOCUMENTS

| | | |
|---|---|---|
| JP | S64-043521 A | 2/1989 |
| JP | H06-128360 A | 5/1994 |
| JP | 2016-216367 A | 12/2016 |
| WO | 2011/004721 A1 | 1/2011 |
| WO | 2017/191767 A1 | 11/2017 |
| WO | 2018/052130 A1 | 3/2018 |
| WO | WO-2018052130 A1 * | 3/2018 ............ C08F 220/06 |
| WO | 2018/203464 A1 | 11/2018 |
| WO | 2020/071361 A1 | 4/2020 |

OTHER PUBLICATIONS

Sep. 28, 2021 International Preliminary Report on Patentability issued in International Patent Application No. PCT/JP2020/015948.
Jun. 16, 2020 Search Report issued in International Patent Application No. PCT/JP2020/015948.

* cited by examiner

*Primary Examiner* — Randy P Gulakowski
*Assistant Examiner* — Ha S Nguyen
(74) *Attorney, Agent, or Firm* — Oliff PLC

(57) ABSTRACT

A protective film-forming composition including good mask (protection) function against a wet etching liquid and a high dry etching rate during processing of semiconductor substrates, including good coverage even in stepped substrates, and from which flat films can be formed due to a small difference in film thickness after embedding; a protective film produced using said composition; a substrate with a resist pattern; and a method for manufacturing a semiconductor device. A protective film-forming composition which protects against a semiconductor wet etching liquid, wherein a reaction product (P) of a diepoxy compound (B) and an bifunctional proton-generating compound (C) contains a structure represented by formula (1) (in formula (1), Ar represents a C6-40 aryl group, n represents an integer of 2-10, —Y— represents —OCO—, —O— or —S—, and * represents the bonding site with the reaction product (P) molecule terminal). The protective film-forming composition further includes an organic solvent (S).

14 Claims, No Drawings

CHEMICAL-RESISTANT PROTECTIVE FILM FORMING COMPOSITION CONTAINING HYDROXYARYL-TERMINATED POLYMER

TECHNICAL FIELD

The present invention relates to a composition for forming a protective film having excellent resistance, particularly to a wet etching liquid for semiconductor in a lithography process in the production of a semiconductor. In addition, the present invention relates to a method for producing a substrate having a resist pattern using the protective film, and a method for producing a semiconductor device.

BACKGROUND ART

A lithography process in the production of a semiconductor, in which a resist underlying film is formed between a substrate and a resist film to be formed on the substrate so as to form a resist pattern having a desired form, has been widely known. Processing of the substrate is conducted after the formation of resist pattern. Although dry etching is mainly used in the step for that processing, wet etching is used depending on the type of the substrate. Patent Literature 1 discloses a composition for forming a protective film for a basic aqueous hydrogen peroxide solution, the composition containing a specific crosslinking agent.

CITATION LIST

Patent Literature

Patent Literature 1: WO 2017/191767 A1

SUMMARY OF INVENTION

Technical Problem

In the case where a resist underlying film is used as an etching mask and the substrate is processed by wet etching, the resist underlying film is required to function as an excellent mask with respect to the wet etching liquid used during the processing of the substrate (that is, so as to protect the substrate under the masked portion).

In such a case, the resist underlying film is used as a protective film for the substrate. Further, when the unnecessary protective film remaining after the wet etching is removed by dry etching, the protective film is required to have such a fast etching rate (high etching rate) that the protective film can be quickly removed by dry etching so as not to damage the substrate.

Furthermore, there is a demand for a protective film-forming composition capable of providing a flat film having excellent step coverage with respect to the so-called stepped substrate and having a small difference in thickness after burying.

Conventionally, for obtaining a film exhibiting a resistance to SC-1 (ammonia-hydrogen peroxide solution), which is a kind of wet etching chemical liquid, a method of applying a low molecular weight compound (for example, gallic acid) as an additive to the film has been used; however, the method could not completely solve the above-mentioned problems.

An object of the present invention is to solve the above-mentioned problems.

Solution to Problem

The present invention encompasses the followings.
[1] A composition for forming a protective film against a wet etching liquid for semiconductor, comprising:
a reaction product (P) of a diepoxy compound (B) and a divalent or multivalent proton-generating compound (C), the reaction product (P) having a structure represented by the following formula (1):

[Chemical formula 1]

$$*-Y-Ar-(OH)_n \qquad \text{Formula (1)}$$

wherein Ar represents an aryl group having 6 to 40 carbon atoms, n represents an integer of 2 to 10, —Y— represents —OCO—, —O—, or —S—, and * indicates a bonding site to a terminal of the molecule of reaction product (P); and further
an organic solvent (S).
[2] The protective film-forming composition according to [1], wherein the divalent or multivalent proton-generating compound (C) has a functional group selected from a hydroxy group, a carboxyl group, a thiol group, an amino group, and an imide group.
[3] The protective film-forming composition according to [1], wherein the divalent or multivalent proton-generating compound (C) is an acid dianhydride.
[4] The protective film-forming composition according to any one of [1] to [3], wherein the reaction product (P) has a unit structure represented by the following formula (2):

[Chemical formula 2]

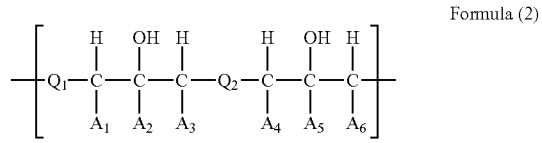

wherein $Q_1$ and $Q_2$ represent a divalent organic group, and $A_1$ to $A_6$ represent a hydrogen atom, a methyl group, or an ethyl group.
[5]
The protective film-forming composition according to claim 4, wherein $Q_1$ in formula (2) is represented by the following formula (3):

[Chemical formula 3]

$$-Z_1-R_2-Z_1- \qquad \text{Formula (3)}$$

wherein $R_2$ represents a direct bond, an alkylene group having 1 to 10 carbon atoms and being optionally interrupted by —O—, —S—, or —S—S—, an alkenylene group having 2 to 6 carbon atoms, or a divalent organic group having at least one of an alicyclic hydrocarbon ring having 3 to 10 carbon atoms and an aromatic hydrocarbon ring having 6 to 14 carbon atoms, wherein the divalent organic group is optionally substituted with at least one group selected from the group consisting of an alkyl group having 1 to 6 carbon atoms, an alkenyl group having 2 to 6 carbon atoms, an alkynyl group having 2 to 6 carbon atoms, a halogen atom, a hydroxy group, a nitro group, a cyano group, a methylidene group, an alkoxy group having 1 to 6 carbon atoms, an alkoxycarbonyl group having 2 to 6 carbon atoms, and an alkylthio group having 1 to 6 carbon atoms, and each of $Z_1$ and $Z_1$ represents —COO—, —OCO—, —O—, or —S—.

[6] The protective film-forming composition according to claim 4 or 5, wherein $Q_2$ in formula (2) is represented by the following formula (4):

[Chemical formula 4]

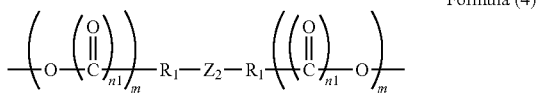

Formula (4)

wherein $R_1$ represents a direct bond or an alkylene group having 1 to 5 carbon atoms, n1 and m represent an integer of 0 or 1, and $Z_2$ is represented by the following formula (5), (6), or (7):

[Chemical formula 5]

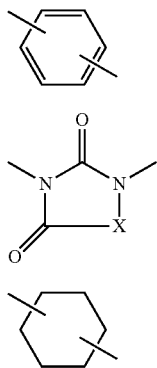

Formula (5)

Formula (6)

Formula (7)

wherein, in formula (6), X is represented by the following formula (8), (9), or (10):

[Chemical formula 6]

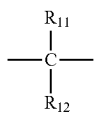

Formula (8)

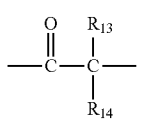

Formula (9)

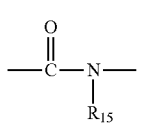

Formula (10)

wherein each of $R_{11}$, $R_{12}$, $R_{13}$, $R_{14}$, and $R_{15}$ independently represents a hydrogen atom, an alkyl group having 1 to 6 carbon atoms, an alkenyl group having 3 to 6 carbon atoms, a benzyl group, or a phenyl group, wherein the phenyl group is optionally substituted with at least one member selected from the group consisting of an alkyl group having 1 to 6 carbon atoms, a halogen atom, a nitro group, a cyano group, an alkoxy group having 1 to 6 carbon atoms, and an alkylthio group having 1 to 6 carbon atoms, and $R_{13}$ and $R_{14}$ are optionally bonded together to form a ring having 3 to 6 carbon atoms.

[7] The protective film-forming composition according to any one of [1] to [6], wherein the Ar includes a benzene, naphthalene, and anthracene structure.

[8] The protective film-forming composition according to any one of [1] to [7], wherein the n is an integer of 2 to 4.

[9] The protective film-forming composition according to any one of [1] to [8], further comprising a crosslinking agent (K).

[10] The protective film-forming composition according to [9], wherein the crosslinking agent (K) is a compound selected from
a compound represented by the following formula (11) or (12):

[Chemical formula 7]

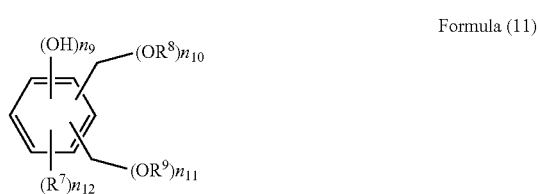

Formula (11)

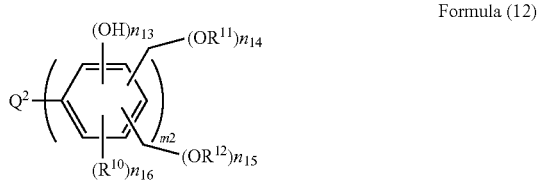

Formula (12)

wherein $Q^2$ represents a single bond or an m2-valent organic group, each of $R^8$, $R^9$, $R^{11}$, and $R^{12}$ represents a hydrogen atom or a methyl group, each of $R^7$ and $R^{10}$ represents an alkyl group having 1 to 10 carbon atoms or an aryl group having 6 to 40 carbon atoms,
n9 represents an integer satisfying $1 \leq n9 \leq 3$, n10 represents an integer satisfying $2 \leq n10 \leq 5$, n11 represents an integer satisfying $0 \leq n11 \leq 3$, n12 represents an integer satisfying $0 \leq n12 \leq 3$, and the integers satisfy $3 \leq (n9+n10+n11+n12) \leq 6$,
n13 represents an integer satisfying $1 \leq n13 \leq 3$, n14 represents an integer satisfying $1 \leq n14 \leq 4$, n15 represents an integer satisfying $0 \leq n15 \leq 3$, n16 represents an integer satisfying $0 \leq n16 \leq 3$, and the integers satisfy $2 \leq (n13+n14+n15+n16) \leq 5$, and m2 represents an integer of 2 to 10,
a melamine compound,
a guanamine compound,
a glycoluril compound, and
an urea compound.

[11] The protective film-forming composition according to any one of [1] to [10], further comprising a crosslinking catalyst.

[12] The protective film-forming composition according to any one of [1] to [11], further comprising a surfactant.

[13] A protective film, which is a baked product of an applied film comprising the protective film-forming composition according to any one of [1] to [13].

[14] A method for producing a substrate having a resist pattern, comprising the steps of:
applying the protective film-forming composition according to any one of [1] to [13] onto a semiconductor substrate and baking the applied composition to form a protective film as a resist underlying film, and forming a resist film on the protective film and then subjecting the resist film to exposure and development to form a resist pattern, wherein the method is used in the production of a semiconductor.

[15] A method for producing a semiconductor device, comprising the steps of:

forming a protective film on a semiconductor substrate optionally having an inorganic film formed on the surface thereof using the protective film-forming composition according to any one of [1] to [13], forming a resist pattern on the protective film, subjecting the protective film to dry etching using the formed resist pattern as a mask so as to expose a surface of the inorganic film or the semiconductor substrate, and, using the dry-etched protective film as a mask, subjecting the inorganic film or the semiconductor substrate to wet etching with a wet etching liquid for semiconductor followed by washing.

Advantageous Effects of Invention

The protective film-forming composition of the present invention is required to have, for example, the following properties with a good balance in a lithography process in the production of a semiconductor: (1) functioning as an excellent mask with respect to the wet etching liquid used during processing of a substrate; (2) further having a high dry etching rate; and (3) having excellent planarization property for a stepped substrate. By virtue of having the properties (1) to (3) with a good balance, microfabrication for a semiconductor substrate can be easily performed using the composition.

DESCRIPTION OF EMBODIMENTS

Description of Terms

The terms used in the present invention have the following respective definitions unless otherwise specified.

Examples of the "alkylene group having 1 to 10 carbon atoms" include a methylene group, an ethylene group, a n-propylene group, an isopropylene group, a cyclopropylene group, a n-butylene group, an isobutylene group, a s-butylene group, a t-butylene group, a cyclobutylene group, a 1-methyl-cyclopropylene group, a 2-methyl-cyclopropylene group, a n-pentylene group, a 1-methyl-n-butylene group, a 2-methyl-n-butylene group, a 3-methyl-n-butylene group, a 1,1-dimethyl-n-propylene group, a 1,2-dimethyl-n-propylene group, 2,2-dimethyl-n-propylene, a 1-ethyl-n-propylene group, a cyclopentylene group, a 1-methyl-cyclobutylene group, a 2-methyl-cyclobutylene group, a 3-methyl-cyclobutylene group, a 1,2-dimethyl-cyclopropylene group, a 2,3-dimethyl-cyclopropylene group, a 1-ethyl-cyclopropylene group, a 2-ethyl-cyclopropylene group, a n-hexylene group, a 1-methyl-n-pentylene group, a 2-methyl-n-pentylene group, a 3-methyl-n-pentylene group, a 4-methyl-n-pentylene group, a 1,1-dimethyl-n-butylene group, a 1,2-dimethyl-n-butylene group, a 1,3-dimethyl-n-butylene group, a 2,2-dimethyl-n-butylene group, a 2,3-dimethyl-n-butylene group, a 3,3-dimethyl-n-butylene group, a 1-ethyl-n-butylene group, a 2-ethyl-n-butylene group, a 1,1,2-trimethyl-n-propylene group, a 1,2,2-trimethyl-n-propylene group, a 1-ethyl-1-methyl-n-propylene group, a 1-ethyl-2-methyl-n-propylene group, a cyclohexylene group, a 1-methyl-cyclopentylene group, a 2-methyl-cyclopentylene group, a 3-methyl-cyclopentylene group, a 1-ethyl-cyclobutylene group, a 2-ethyl-cyclobutylene group, a 3-ethyl-cyclobutylene group, a 1,2-dimethyl-cyclobutylene group, a 1,3-dimethyl-cyclobutylene group, a 2,2-dimethyl-cyclobutylene group, a 2,3-dimethyl-cyclobutylene group, a 2,4-dimethyl-cyclobutylene group, a 3,3-dimethyl-cyclobutylene group, a 1-n-propyl-cyclopropylene group, a 2-n-propyl-cyclopropylene group, a 1-isopropyl-cyclopropylene group, a 2-isopropyl-cyclopropylene group, a 1,2,2-trimethyl-cyclopropylene group, a 1,2,3-trimethyl-cyclopropylene group, a 2,2,3-trimethyl-cyclopropylene group, a 1-ethyl-2-methyl-cyclopropylene group, a 2-ethyl-1-methyl-cyclopropylene group, a 2-ethyl-2-methyl-cyclopropylene group, a 2-ethyl-3-methyl-cyclopropylene group, a n-heptylene group, a n-octylene group, a n-nonylene group, and a n-decanylene group.

Examples of the "alkyl group having 1 to 10 carbon atoms" include a methyl group, an ethyl group, a n-propyl group, an i-propyl group, a cyclopropyl group, a n-butyl group, an i-butyl group, a s-butyl group, a t-butyl group, a cyclobutyl group, a 1-methyl-cyclopropyl group, a 2-methyl-cyclopropyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, a 2-ethyl-3-methyl-cyclopropyl group, a decyl group, an undecyl group, a dodecyl group, a tridecyl group, a tetradecyl group, a pentadecyl group, a hexadecyl group, a heptadecyl group, an octadecyl group, a nonadecyl group, and an icodecyl group.

Examples of the "aryl group having 6 to 40 carbon atoms" include a phenyl group, an o-methylphenyl group, a m-methylphenyl group, a p-methylphenyl group, an o-chlorophenyl group, a m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, a m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

Examples of the "alkenyl group having 2 to 10 carbon atoms" include an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-i-propylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group.

The "alkenylene group having 2 to 6 carbon atoms" means a group corresponding to the alkenyl group having 2 to 6 carbon atoms in the above-mentioned "alkenyl group having 2 to 10 carbon atoms", wherein one hydrogen atom of the alkenyl group is removed so that the group becomes divalent.

Examples of the "alicyclic hydrocarbon ring having 3 to 10 carbon atoms" include cyclopropane, cyclobutane, cyclopentane, cyclohexane, cycloheptane, cyclooctane, cyclononane, cyclodecane, spirobicyclopentane, bicyclo[2.1.0]pentane, bicyclo[3.2.1]octane, tricyclo[3.2.1.0$^{2,7}$]octane, and spiro[3,4]octane.

The "aromatic hydrocarbon ring having 6 to 14 carbon atoms" means a group corresponding to the above-mentioned "aryl group having 6 to 40 carbon atoms", which has an aromatic hydrocarbon ring having 6 to 14 carbon atoms.

The "alkynyl group having 2 to 6 carbon atoms" means a group corresponding to the alkenyl group having 2 to 6 carbon atoms in the above-mentioned "alkenyl group having 2 to 10 carbon atoms", wherein the double bond of the alkenyl group is changed to a triple bond.

Examples of the "alkoxy group having 1 to 20 carbon atoms" include a methoxy group, an ethoxy group, a n-propoxy group, an i-propoxy group, a n-butoxy group, an i-butoxy group, a s-butoxy group, a t-butoxy group, a n-pentyloxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, a n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, a 1-ethyl-2-methyl-n-propoxy group, a cyclopentyloxy group, a cyclohexyloxy group, a norbornyloxy group, an adamantyloxy group, an adamantanemethyloxy group, an adamantaneethyloxy group, a tetracyclodecanyloxy group, and a tricyclodecanyloxy group.

Examples of the "alkoxycarbonyl group having 1 to 6 carbon atoms" include a methoxycarbonyl group, an ethoxycarbonyl group, and an isopropoxycarbonyl group.

Examples of the "alkylthio group having 1 to 6 carbon atoms" include a methylthio group, an ethylthio group, a propylthio group, a butylthio group, a pentylthio group, and a hexylthio group.

Examples of the "halogen atom" include a fluorine atom, a chlorine atom, a bromine atom, and an iodine atom.

<Protective Film-Forming Composition>

The protective film-forming composition of the present invention is a composition for forming a protective film against a wet etching liquid for semiconductor, comprising a reaction product (P) of a diepoxy compound (B) and a divalent or multivalent proton-generating compound (C), wherein the reaction product (P) has at a terminal thereof a structure represented by the following formula (1):

[Chemical formula 8]

$$*-Y-Ar-(OH)_n \qquad \text{Formula (1)}$$

wherein Ar represents an aryl group having 6 to 40 carbon atoms, n represents an integer of 2 to 10, —Y— represents —OCO—, —O—, or —S—, and * indicates a bonding site to a terminal of the molecule of reaction product (P), and further an organic solvent (S).

The functional group of divalent or multivalent proton-generating compound (C) is a functional group capable of generating protons, and, specifically, is preferably selected from a hydroxy group, a carboxyl group, a thiol group, an amino group, and an imide group.

The above-mentioned divalent or multivalent proton-generating compound (C) may be an acid dianhydride.

The protective film-forming composition of the present invention is reaction product (P) of diepoxy compound (B) and divalent or multivalent proton-generating compound (C), preferably reaction product (P) of diepoxy compound (B) and divalent, trivalent, or tetravalent proton-generating compound (C), preferably reaction product (P) of diepoxy compound (B) and divalent or trivalent proton-generating compound (C), preferably reaction product (P) of diepoxy compound (B) and divalent proton-generating compound (C).

It is preferred that reaction product (P) has a unit structure represented by the following formula (2):

[Chemical formula 9]

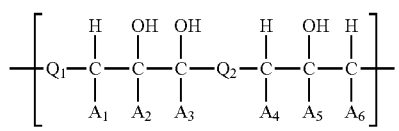

Formula (2)

wherein $Q_1$ and $Q_2$ represent a divalent organic group, and $A_1$ to $A_6$ represent a hydrogen atom, a methyl group, or an ethyl group.

It is preferred that $Q_1$ in formula (2) above is represented by the following formula (3):

[Chemical formula 10]

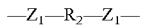

Formula (3)

wherein $R_2$ represents a direct bond, an alkylene group having 1 to 10 carbon atoms and being optionally interrupted by —O—, —S—, or —S—S—, an alkenylene group having 2 to 6 carbon atoms, or a divalent organic group having at least one of an alicyclic hydrocarbon ring having 3 to 10 carbon atoms and an aromatic hydrocarbon ring having 6 to 14 carbon atoms, wherein the divalent organic group is optionally substituted with at least one group selected from the group consisting of an alkyl group having 1 to 6 carbon atoms, an alkenyl group having 2 to 6 carbon atoms, an alkynyl group having 2 to 6 carbon atoms, a halogen atom, a hydroxy group, a nitro group, a cyano group, a methylidene group, an alkoxy group having 1 to 6 carbon atoms, an alkoxycarbonyl group having 2 to 6 carbon atoms, and an alkylthio group having 1 to 6 carbon atoms, and each of $Z_1$ and $Z_1$ represents —COO—, —OCO—, —O—, or —S—.

It is preferred that $Q_2$ in formula (2) above is represented by the following formula (4):

[Chemical formula 11]

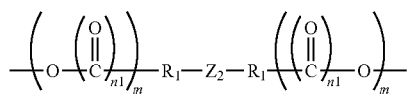

Formula (4)

wherein $R_1$ represents a direct bond or an alkylene group having 1 to 5 carbon atoms, n1 and m represent an integer of 0 or 1, and $Z_2$ is represented by the following formula (5), (6), or (7):

[Chemical formula 12]

Formula (5)

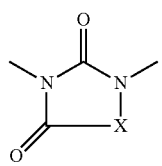

Formula (6)

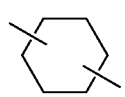

Formula (7)

wherein, in formula (6), X is represented by the following formula (8), (9), or (10):

[Chemical formula 13]

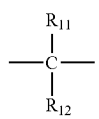

Formula (8)

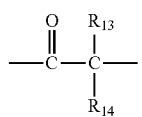

Formula (9)

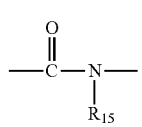

Formula (10)

wherein each of $R_{11}$, $R_{12}$, $R_{13}$, $R_{14}$, and $R_{15}$ independently represents a hydrogen atom, an alkyl group having 1 to 6 carbon atoms, an alkenyl group having 3 to 6 carbon atoms, a benzyl group, or a phenyl group, wherein the phenyl group is optionally substituted with at least one member selected from the group consisting of an alkyl group having 1 to 6 carbon atoms, a halogen atom, a nitro group, a cyano group, an alkoxy group having 1 to 6 carbon atoms, and an alkylthio group having 1 to 6 carbon atoms, and $R_{13}$ and $R_{14}$ are optionally bonded together to form a ring having 3 to 6 carbon atoms.

Examples of the "ring having 3 to 6 carbon atoms" include cyclopropane, cyclobutane, cyclopentane, cyclopentadiene, and cyclohexane.

It is preferred that Ar includes a benzene, naphthalene, and anthracene structure.

It is preferred that n is an integer of 2 to 4.

Specific examples of diepoxy compounds (B) in the present invention include the below-shown compounds (a-1) to (a-24).

[Chemical formula 14]
(a-1) 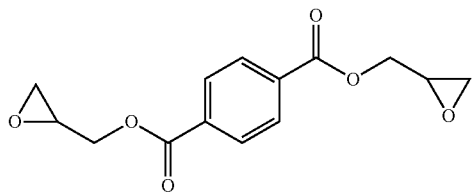
(a-2) 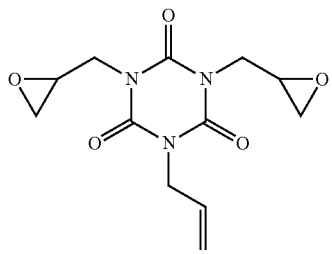
(a-3) 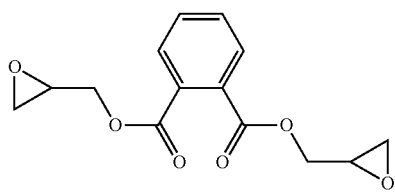
(a-4) 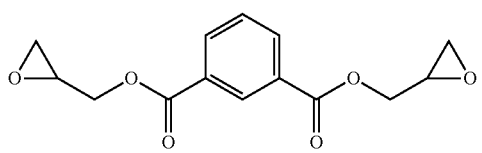
(a-5) 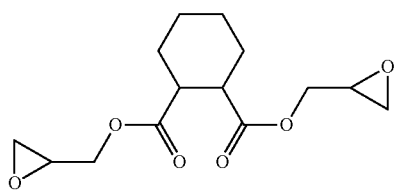
(a-6) 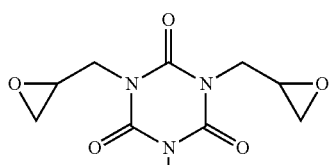
(a-7) 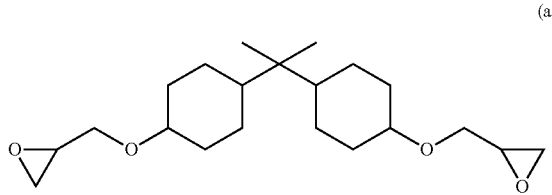
(a-8) 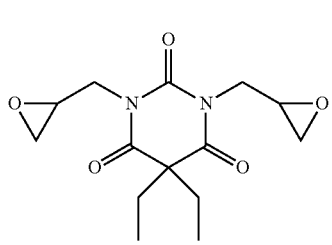
(a-9) 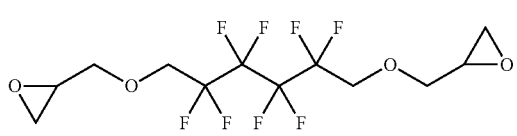
(a-10) 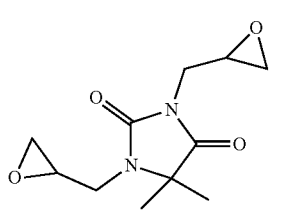
(a-11) 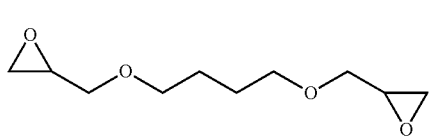
(a-12) 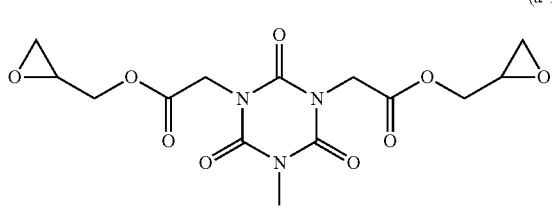
(a-13) 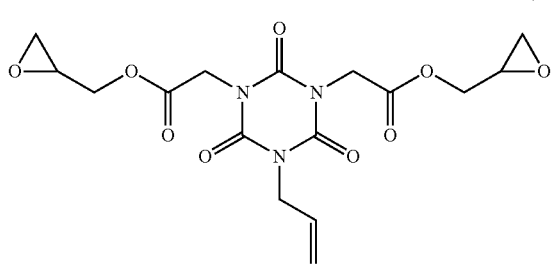
(a-14) 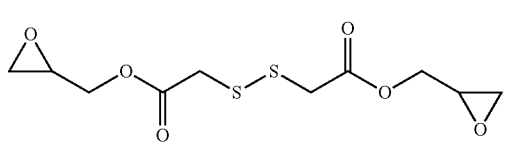
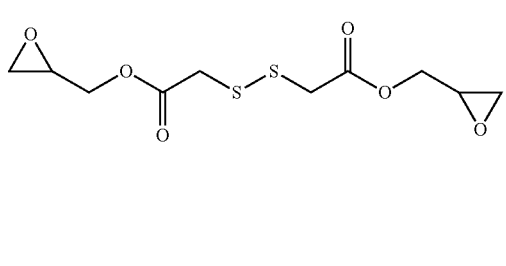

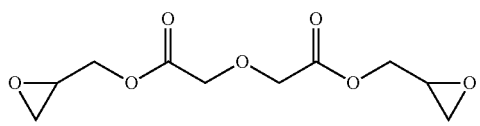
(a-15)
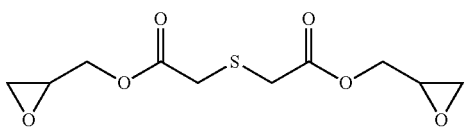
(a-16)
[Chemical formula 15]
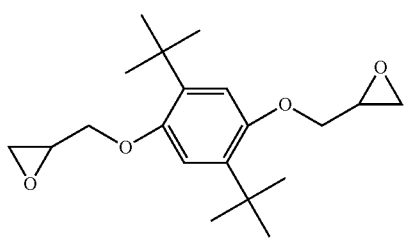
(a-17)
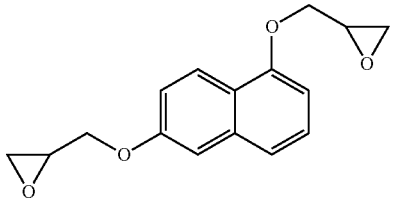
(a-18)
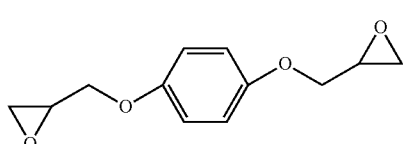
(a-19)
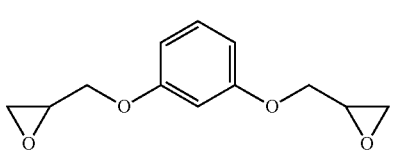
(a-20)
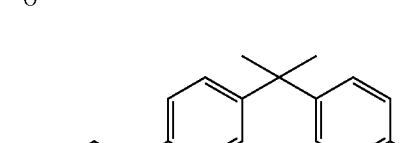
(a-21)
(a-22)
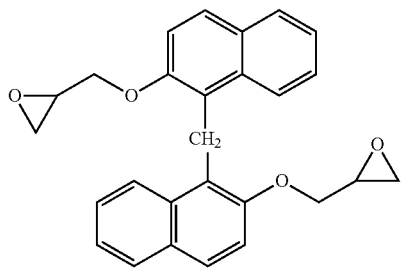
(a-23)
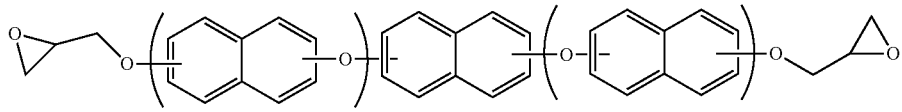
(a-24)
Specific examples of divalent or multivalent proton-generating compounds (C) in the present invention include the below-shown compounds (b-1) to (b-27).
[Chemical formula 16]
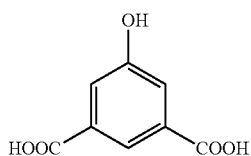
(b-1)
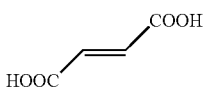
(b-2)
(b-3)
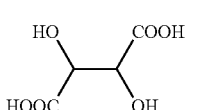
(b-4)
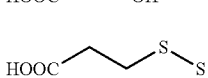
(b-5)

-continued
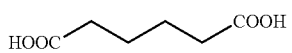
(b-6)
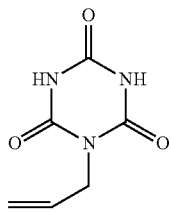
(b-7)
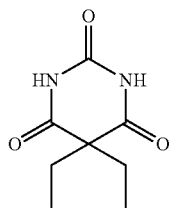
(b-8)
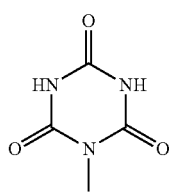
(b-9)
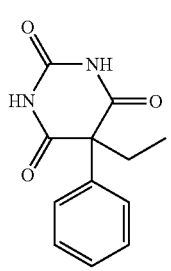
(b-10)
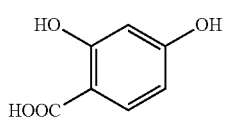
(b-11)
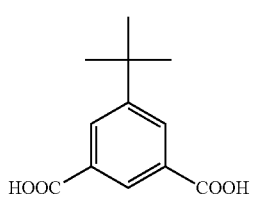
(b-12)
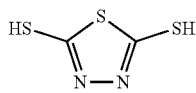
(b-13)
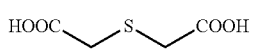
(b-14)
-continued
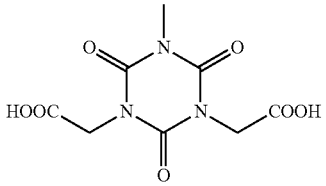
(b-16)
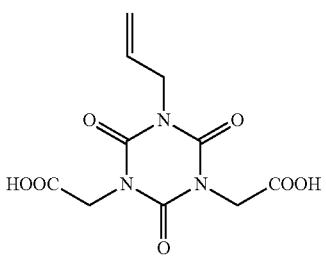
(b-17)
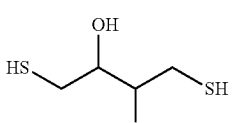
(b-18)
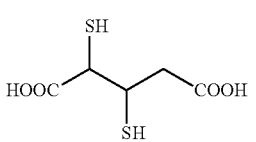
(b-19)
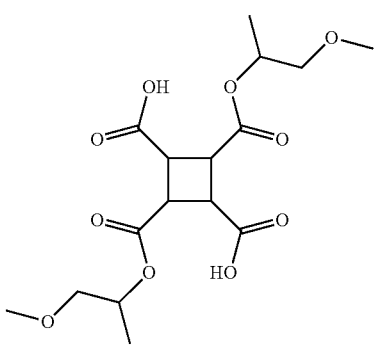
(b-20)
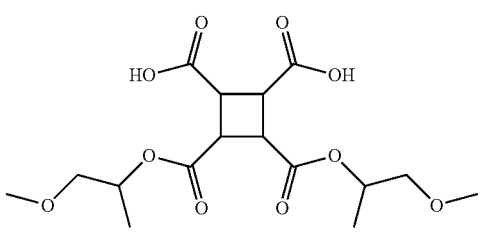
(b-21)
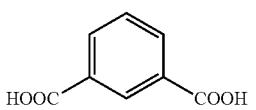
(b-22)

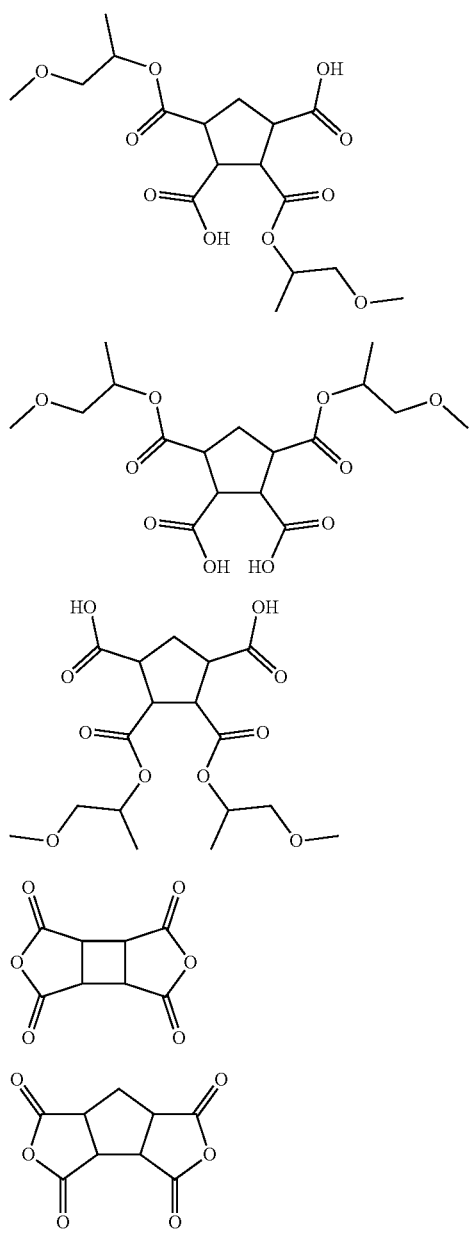
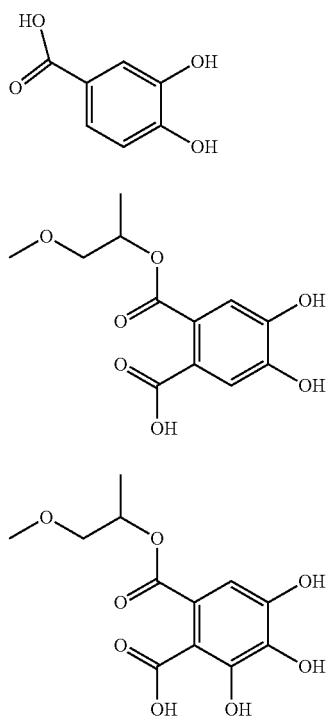
The protective film-forming composition of the present invention may be reaction product (P) produced by reacting the above-mentioned diepoxy compound (B) and divalent or multivalent proton-generating compound (C) and further the below-shown compounds (c-1) to (c-17).
[Chemical formula 17]
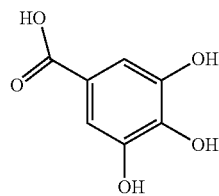
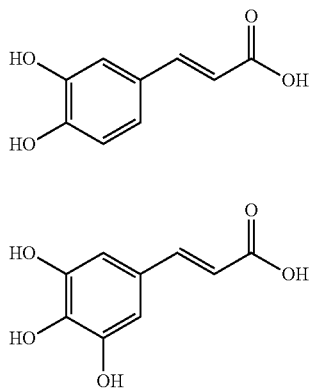

-continued (c-9) 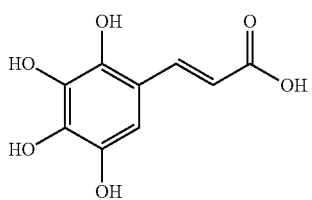

(c-10) 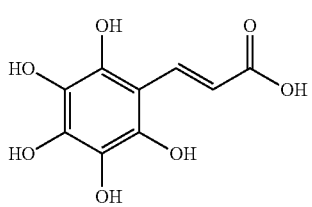

(c-11) 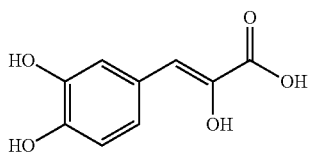

(c-12) 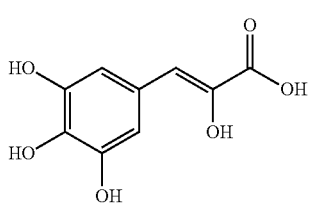

(c-13) 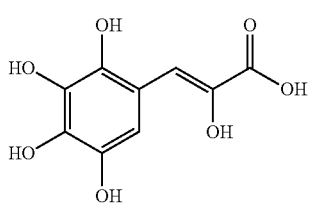

(c-14) 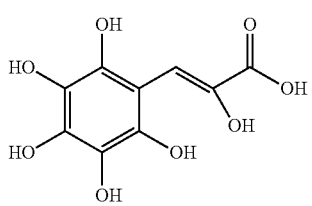

(c-15) 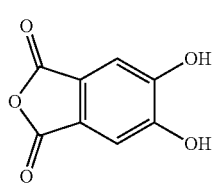

(c-16) 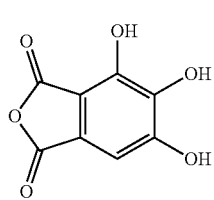

-continued (c-17) 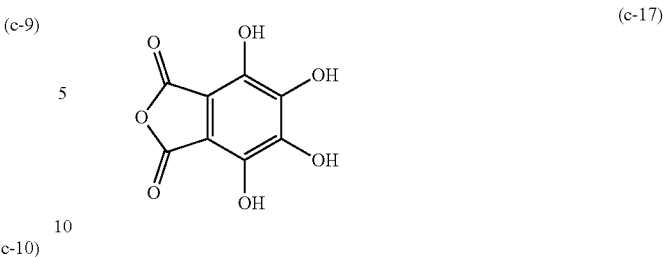

The protective film-forming composition of the present invention may further comprise a crosslinking agent (K).

The above-mentioned crosslinking agent (K) may be a compound selected from
a compound represented by the following formula (11) or (12):

[Chemical formula 18]

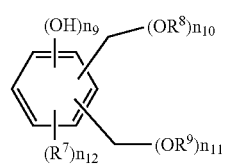

Formula (11)

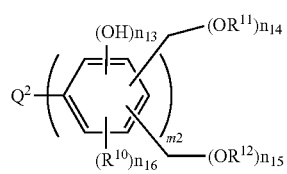

Formula (12)

wherein $Q^2$ represents a single bond or an m2-valent organic group, each of $R^8$, $R^9$, $R^{11}$, and $R^{12}$ represents a hydrogen atom or a methyl group, each of $R^7$ and $R^{10}$ represents an alkyl group having 1 to 10 carbon atoms or an aryl group having 6 to 40 carbon atoms, n9 represents an integer satisfying $1 \leq n9 \leq 3$, n10 represents an integer satisfying $2 \leq n10 \leq 5$, n11 represents an integer satisfying $0 \leq n11 \leq 3$, n12 represents an integer satisfying $0 \leq n12 \leq 3$, and the integers satisfy $3 = (n9+n10+n11+n12) \leq 6$, n13 represents an integer satisfying $1 \leq n13 \leq 3$, n14 represents an integer satisfying $1 \leq n14 \leq 4$, n15 represents an integer satisfying $0 \leq n15 \leq 3$, n16 represents an integer satisfying $0 \leq n16 \leq 3$, and the integers satisfy $2 \leq (n13+n14+n15+n16) \leq 5$, and m2 represents an integer of 2 to 10,
and which is described in WO2014/208542,
a melamine compound,
a guanamine compound,
a glycoluril compound, and
an urea compound.

Specific examples of the melamine compounds are not limited to those mentioned below, but include hexamethylolmelamine, hexamethoxymethylmelamine, compounds corresponding to hexamethylolmelamine having 1 to 6 methylol groups methoxymethylated or a mixture thereof, hexamethoxyethylmelamine, hexaacyloxymethylmelamine, and compounds corresponding to hexamethylolmelamine having 1 to 6 methylol groups acyloxymethylated or a mixture thereof. Specific examples of epoxy compounds include tris(2,3-epoxypropyl) isocyanurate, trimethylolmethane triglycidyl ether, trimethylolpropane triglycidyl ether, and triethylolethane triglycidyl ether.

Specific examples of the guanamine compounds are not limited to those mentioned below, but include tetramethylolguanamine, tetramethoxymethylguanamine, compounds corresponding to tetramethylolguanamine having 1 to 4 methylol groups methoxymethylated or a mixture thereof, tetramethoxyethylguanamine, tetraacyloxyguanamine, and compounds corresponding to tetramethylolguanamine having 1 to 4 methylol groups acyloxymethylated or a mixture thereof.

Specific examples of glycoluril compounds include tetramethylolglycoluril, tetramethoxyglycoluril, tetramethoxymethylglycoluril, compounds corresponding to tetramethylolglycoluril having 1 to 4 methylol groups methoxymethylated or a mixture thereof, and compounds corresponding to tetramethylolglycoluril having 1 to 4 methylol groups acyloxymethylated or a mixture thereof. Specific examples of urea compounds include tetramethylolurea, tetramethoxymethylurea, compounds corresponding to tetramethylolurea having 1 to 4 methylol groups methoxymethylated or a mixture thereof, and tetramethoxyethylurea.

Specific examples of the compounds containing an alkenyl ether group are not limited to those mentioned below, but include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylolpropane trivinyl ether.

Of these, a glycoluril compound is preferred, and, specifically, tetramethylolglycoluril, tetramethoxyglycoluril, tetramethoxymethylglycoluril, compounds corresponding to tetramethylolglycoluril having 1 to 4 methylol groups methoxymethylated or a mixture thereof, and compounds corresponding to tetramethylolglycoluril having 1 to 4 methylol groups acyloxymethylated or a mixture thereof are preferred, and tetramethoxymethylglycoluril is preferred.

Examples of crosslinking agents (K) include compounds having a partial structure of formula (5-1) below, and polymers or oligomers having repeating units of formula (5-2) below.

[Chemical formula 19]

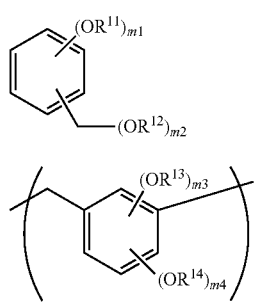

Formula (5-1)

Formula (5-2)

The above-mentioned $R^{11}$, $R^{12}$, $R^{13}$, and $R^{14}$ are a hydrogen atom or an alkyl group having 1 to 10 carbon atoms, and, with respect to the alkyl group, those mentioned above as examples of alkyl groups may be used.

m1 satisfies the inequality: $1 \leq m1 \leq 6-m2$, m2 satisfies the inequality: $1 \leq m2 \leq 5$, m3 satisfies the inequality: $1 \leq m3 \leq 4-m2$, and m4 satisfies the inequality: $1 \leq m4 \leq 3$.

Examples of the compounds, polymers, and oligomers of the formulae (5-1) and 5-2 are shown below.

[Chemical formula 20]

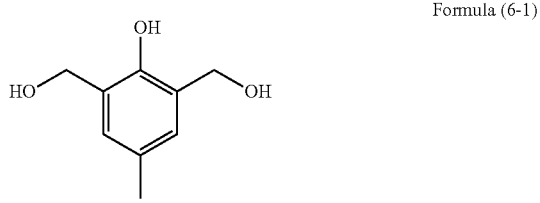

Formula (6-1)

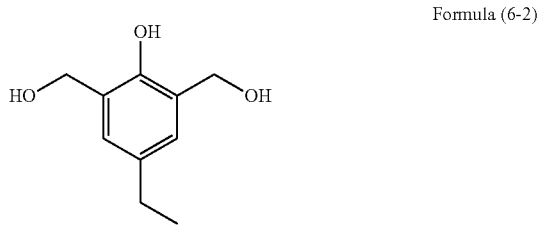

Formula (6-2)

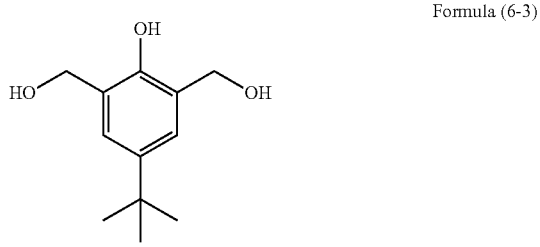

Formula (6-3)

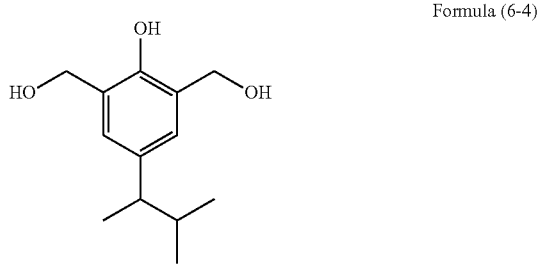

Formula (6-4)

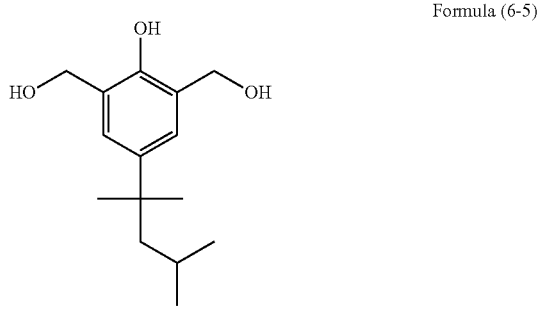

Formula (6-5)

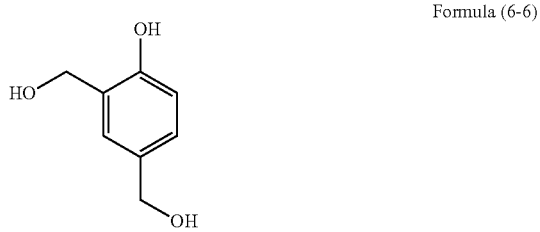

Formula (6-6)

-continued
Formula (6-6)
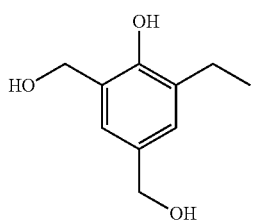
Formula (6-7)
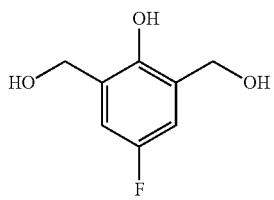
Formula (6-8)
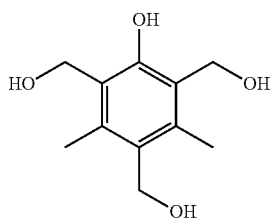
Formula (6-9)
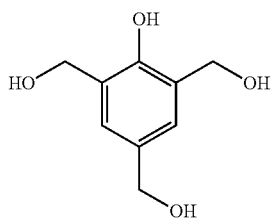
Formula (6-10)
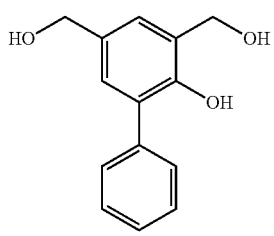
Formula (6-11)
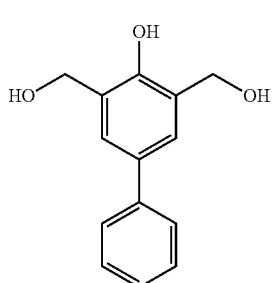
Formula (6-12)
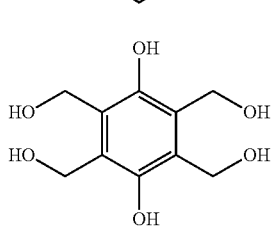
Formula (6-13)
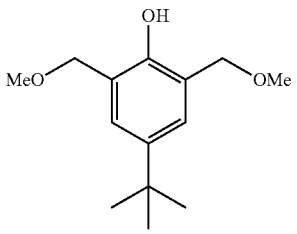
Formula (6-14)
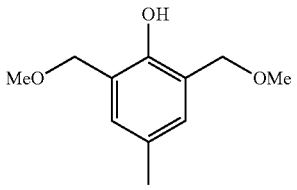
[Chemical formula 21]
Formula (6-15)
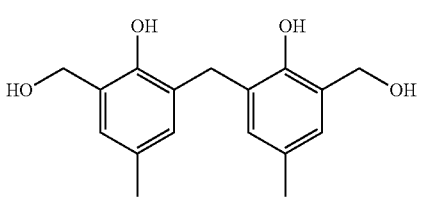
Formula (6-16)
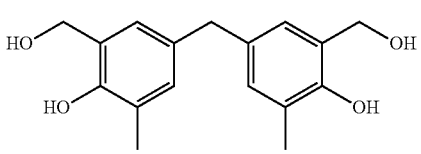
Formula (6-17)
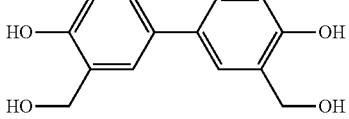
Formula (6-18)
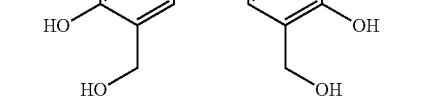
Formula (6-19)
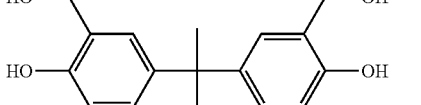
Formula (6-20)

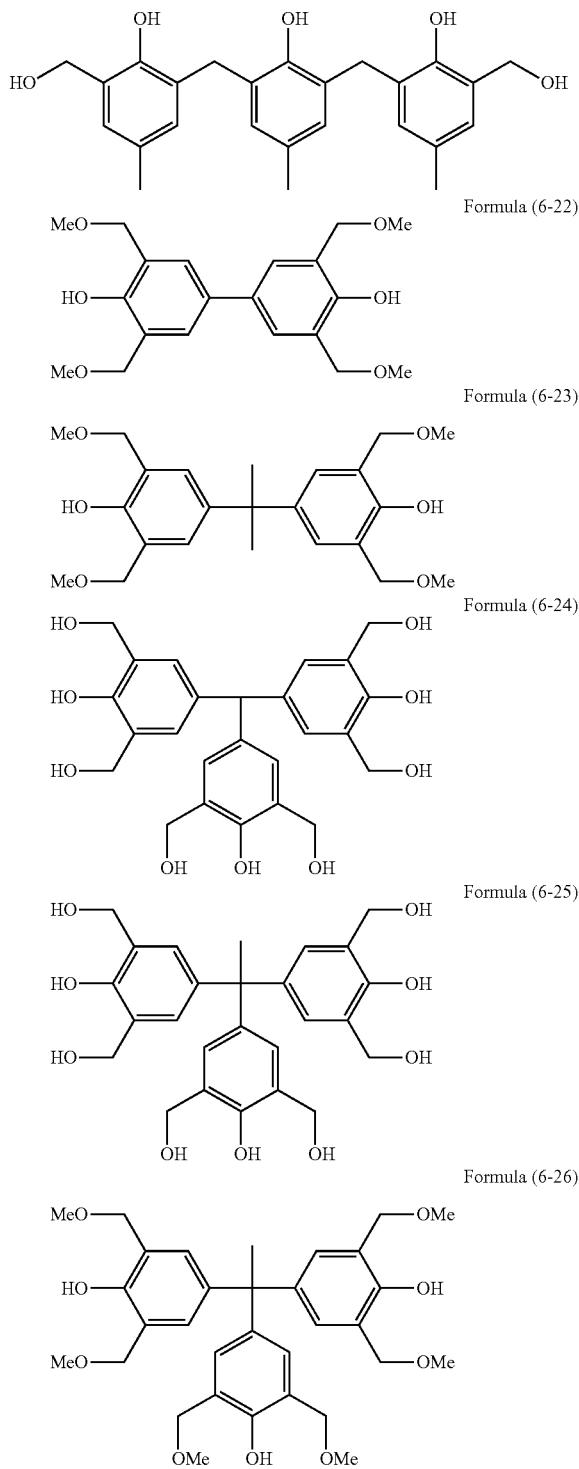

The above-mentioned compounds are available as products of Asahi Yukizai Corporation and Honshu Chemical Industry Co., Ltd. For example, among the above-mentioned crosslinking agents, the compound of formula (6-22) is available as trade name: TMOM-BP, manufactured by Asahi Yukizai Corporation.

The amount of the crosslinking agent added varies depending on, for example, the application solvent used, the substrate used, the required solution viscosity, or the required film form; however, it is within the range of 0.001 to 80% by mass, preferably 0.01 to 50% by mass, further preferably 0.1 to 40% by mass, based on the mass of solid of the protective film-forming composition. The crosslinking agent possibly causes a crosslinking reaction due to self-condensation; however, when a crosslinkable substituent is present in the above-mentioned polymer in the present invention, the crosslinking agent and the crosslinkable substituent can together cause a crosslinking reaction.

[Crosslinking Catalyst]

The protective film-forming composition of the present invention can contain, as an optional component, a crosslinking catalyst for accelerating the crosslinking reaction. As the crosslinking catalyst, an acidic compound, a basic compound, or a compound capable of generating an acid or a base due to heat may be used; however, a crosslinking acid catalyst is preferred. As the acidic compound, a sulfonic acid compound or a carboxylic acid compound may be used, and, as the compound capable of generating an acid due to heat, a thermal acid generator may be used.

Examples of sulfonic acid compounds or carboxylic acid compounds include p-toluenesulfonic acid, trifluoromethanesulfonic acid, pyridinium trifluoromethanesulfonate, pyridinium p-toluenesulfonate, salicylic acid, camphorsulfonic acid, 5-sulfosalicylic acid, 4-chlorobenzenesulfonic acid, 4-phenolsulfonic acid, pyridinium 4-phenolsulfonate, benzenedisulfonic acid, 1-naphthalenesulfonic acid, 4-nitrobenzenesulfonic acid, citric acid, benzoic acid, and hydroxybenzoic acid.

Examples of thermal acid generators include K-PURE [registered trademark] CXC-1612, K-PURE CXC-1614, K-PURE TAG-2172, K-PURE TAG-2179, K-PURE TAG-2678, K-PURE TAG2689 (each of which is manufactured by King Industries, Inc.), and SI-45, SI-60, SI-80, SI-100, SI-110, SI-150 (each of which is manufactured by Sanshin Chemical Industry Co., Ltd.).

These crosslinking catalysts may be used each alone or in combination of two or more. Further, as the basic compound, an amine compound or an ammonium hydroxide compound may be used, and, as the compound capable of generating a base due to heat, urea may be used.

Examples of amine compounds include tertiary amines, such as triethanolamine, tributanolamine, trimethylamine, triethylamine, trinormalpropylamine, triisopropylamine, trinormalbutylamine, tri-tert-butylamine, trinormaloctylamine, triisopropanolamine, phenyldiethanolamine, stearyldiethanolamine, and diazabicyclooctane, and aromatic amines, such as pyridine and 4-dimethylaminopyridine. Further examples of amine compounds include primary amines, such as benzylamine and normalbutylamine, and secondary amines, such as diethylamine and dinormalbutylamine. These amine compounds may be used each alone or in combination of two or more.

Examples of ammonium hydroxide compounds include tetramethylammonium hydroxide, tetraethylammonium hydroxide, tetrapropylammonium hydroxide, tetrabutylammonium hydroxide, benzyltrimethylammonium hydroxide, benzyltriethylammonium hydroxide, cetyltrimethylammonium hydroxide, phenyltrimethylammonium hydroxide, and phenyltriethylammonium hydroxide.

As the compound capable of generating a base due to heat, for example, there may be used a compound that has a thermally unstable group, such as an amide group, an urethane group, or an aziridine group, so that it forms an amine by heating it. Further examples of the compounds capable of generating a base due to heat include urea, benzyltrimethylammonium chloride, benzyltriethylammonium chloride, benzyldimethylphenylammonium chloride, benzyldodecyldimethylammonium chloride, benzyltributylammonium chloride, and choline chloride.

When the protective film-forming composition contains a crosslinking catalyst, the amount of the crosslinking catalyst contained is within the range of 0.0001 to 20% by mass, preferably 0.01 to 15% by mass, further preferably 0.1 to 10% by mass, based on the mass of solid of the protective film-forming composition.

[Surfactant]

The protective film-forming composition of the present invention may contain, as an optional component, a surfactant for improving the application properties with respect to a semiconductor substrate. Examples of the surfactants include nonionic surfactants, e.g., polyoxyethylene alkyl ethers, such as polyoxyethylene lauryl ether, polyoxyethylene stearyl ether, polyoxyethylene cetyl ether, and polyoxyethylene oleyl ether; polyoxyethylene alkyl aryl ethers, such as polyoxyethylene octyl phenyl ether and polyoxyethylene nonyl phenyl ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorine surfactants, such as EFTOP [registered trademark] EF301, EFTOP EF303, EFTOP EF352 (manufactured by Mitsubishi Materials Electronic Chemicals Co., Ltd.), MEGAFACE [registered trademark] F171, MEGAFACE F173, MEGAFACE R-30, MEGAFACE R-40, MEGAFACE R-40-LM (manufactured by DIC Corporation), Fluorad FC430, Fluorad FC431 (manufactured by Sumitomo 3M), and AsahiGuard [registered trademark] AG710, Surflon [registered trademark] S-382, Surflon SC101, Surflon SC102, Surflon SC103, Surflon SC104, Surflon SC105, Surflon SC106 (manufactured by AGC Inc.), and organosiloxane polymer KP341 (manufactured by Shin-Etsu Chemical Co., Ltd.). These surfactants may be used each alone or in combination of two or more. When the protective film-forming composition contains a surfactant, the amount of the surfactant contained is within the range of 0.0001 to 10% by mass, preferably 0.01 to 5% by mass, based on the mass of solid of the protective film-forming composition.

[Organic Solvent (S)]

The protective film-forming composition of the present invention may be prepared by dissolving the above-mentioned components in an organic solvent (S), and is used in a uniform solution state.

With respect to organic solvent (S) for the protective film-forming composition of the present invention, there is no particular limitation as long as it is a solvent that can dissolve therein the compound containing in the molecule thereof at least a pair of two hydroxy groups adjacent to each other, or a polymer thereof, and any of such solvents may be used. Particularly, the protective film-forming composition of the present invention is used in a uniform solution state, and therefore, taking the application properties of the composition into consideration, it is recommended that an organic solvent generally used in a lithography process should be used.

Examples of the organic solvents include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide, and N,N-dimethylacetamide. These solvents may be used each alone or in combination of two or more.

Of these solvents, for example, propylene glycol monomethyl ether, propylene glycol monomethyl ether acetate, ethyl lactate, butyl lactate, and cyclohexanone are preferred. Especially preferred are propylene glycol monomethyl ether and propylene glycol monomethyl ether acetate.

[Other Components]

In the protective film-forming composition of the present invention, for example, a light absorber, a rheology modifier, or a bonding auxiliary may be added. The rheology modifier is effective in improving the fluidity of the protective film-forming composition. The bonding auxiliary is effective in improving the adhesion between a semiconductor substrate or a resist and the resist underlying film.

With respect to the light absorber, for example, a commercially available light absorber described in "Kougyo-you Shikiso no Gijutsu to Shijou (Techniques and Markets of Industrial Dyes)" (CMC Publishing Co., Ltd.) or "Senryo Binran (Dye Handbook)" (edited by The Society of Synthetic Organic Chemistry, Japan), for example, C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; and C. I. Pigment Brown 2 may be preferably used. The light absorber is incorporated generally in an amount of 10% by mass or less, preferably 5% by mass or less, based on the mass of solid of the protective film-forming composition.

A rheology modifier is added mainly for the purpose of improving the fluidity of the protective film-forming composition, particularly for improving the uniformity of the thickness of the protective film or the filling of the inside of hole with the protective film-forming composition in the baking step. Specific examples of rheology modifiers include phthalic acid derivatives, such as dimethyl phthalate, diethyl phthalate, diisobutyl phthalate, dihexyl phthalate, and butylisodecyl phthalate; adipic acid derivatives, such as dinormalbutyl adipate, diisobutyl adipate, diisooctyl adipate, and octyldecyl adipate; maleic acid derivatives, such as dinormalbutyl maleate, diethyl maleate, and dinonyl maleate; oleic acid derivatives, such as methyl oleate, butyl oleate, and tetrahydrofurfuryl oleate; and stearic acid derivatives, such as normalbutyl stearate and glyceryl stearate. The rheology modifier is incorporated generally in an amount of less than 30% by mass, based on the mass of solid of the protective film-forming composition.

A bonding auxiliary is added mainly for the purpose of improving the adhesion between a substrate or a resist and the protective film-forming composition to prevent the resist from peeling off particularly in the development. Specific examples of bonding auxiliaries include chlorosilanes, such as trimethylchlorosilane, dimethylmethylolchlorosilane, methyldiphenylchlorosilane, and chloromethyldimethylchlorosilane; alkoxysilanes, such as trimethylmethoxysilane, dimethyldiethoxysilane, methyldimethoxysilane, dimethylmethylolethoxysilane, diphenyldimethoxysilane, and phenyltriethoxysilane; silazanes, such as hexamethyldisilazane, N,N'-bis(trimethylsilyl)urea, dimethyltrimethylsilylamine, and trimethylsilylimidazole; silanes, such as methyloltrichlorosilane, γ-chloropropyltrimethoxysilane, γ-aminopropyltriethoxysilane, and γ-glycidoxypropyltrimethoxysilane; heterocyclic compounds, such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; and urea or thiourea compounds, such as 1,1-dimethylurea and 1,3-dimethylurea. The bonding auxiliary is incorporated generally in an amount of less than 5% by mass, preferably less than 2% by mass, based on the mass of solid of the protective film-forming composition.

[Protective Film-Forming Composition]

The protective film-forming composition of the present invention generally has a solid content of 0.1 to 70% by mass, preferably 0.1 to 60% by mass. The solid content indicates the content of solid remaining after removing the solvent from the all components of the protective film-forming composition. The proportion of the polymer in the solid is preferably within the range of 1 to 100% by mass, 1 to 99.9% by mass, 50 to 99.9% by mass, 50 to 95% by mass, and 50 to 90% by mass in increasing preference.

[Method for Producing a Substrate Having a Resist Pattern and Method for Producing a Semiconductor Device]

Hereinbelow, a method for producing a substrate having a resist pattern and a method for producing a semiconductor device, each using the protective film-forming composition of the present invention, will be described.

The substrate having a resist pattern in the present invention may be produced by applying the above-described protective film-forming composition onto a semiconductor substrate and baking the applied composition.

Examples of semiconductor substrates, to which the protective film-forming composition of the present invention is applied, include a silicon wafer, a germanium wafer, and compound semiconductor wafers, such as gallium arsenide, indium phosphide, gallium nitride, indium nitride, and aluminum nitride.

When a semiconductor substrate having an inorganic film formed on the surface thereof is used, the inorganic film is formed by, for example, an ALD (atomic layer deposition) method, a CVD (chemical vapor deposition) method, a reactive sputtering method, an ion plating method, a vacuum deposition method, or a spin coating method (spin on glass: SOG). Examples of the inorganic films include a polysilicon film, a silicon oxide film, a silicon nitride film, a silicon nitride oxide film, a BPSG (Boro-Phospho Silicate Glass) film, a titanium nitride film, a titanium nitride oxide film, a tungsten nitride film, a gallium nitride film, and a gallium arsenide film.

The protective film-forming composition of the present invention is applied onto the above-mentioned semiconductor substrate by an appropriate application method, such as a spinner or a coater. Then, the applied composition is baked using a heating means, such as a hotplate, to form a protective film. The conditions for baking are appropriately selected from those at a baking temperature of 100 to 400° C. for a baking time of 0.3 to 60 minutes. Preferred conditions for baking are those at a baking temperature of 120 to 350° C. for a baking time of 0.5 to 30 minutes, and more preferred conditions are those at a baking temperature of 150 to 300° C. for a baking time of 0.8 to 10 minutes. The thickness of the formed protective film is, for example, within the range of 0.001 to 10 μm, preferably 0.002 to 1 μm, more preferably 0.005 to 0.5 μm. When the temperature during the baking is lower than the above range, it is likely that crosslinking unsatisfactorily proceeds, making it difficult to obtain a resistance of the formed protective film to a resist solvent or a basic aqueous hydrogen peroxide solution. To the contrary, when the temperature during the baking is higher than the above range, the resultant protective film is likely to suffer decomposition due to heat.

Exposure through a mask (reticle) for forming a predetermined pattern is conducted, and, for example, an i-line, a KrF excimer laser, an ArF excimer laser, an EUV (extreme ultraviolet light), or an EB (electron beam) is used. In development, an alkaline developer is used, and the conditions are appropriately selected from those at a development temperature of 5 to 50° C. for a development time of 10 to 300 seconds. As an alkaline developer, there may be used, for example, an aqueous solution of an alkali, e.g., an inorganic alkali, such as sodium hydroxide, potassium hydroxide, sodium carbonate, sodium silicate, sodium metasilicate, or aqueous ammonia; a primary amine, such as ethylamine or n-propylamine; a secondary amine, such as diethylamine or di-n-butylamine; a tertiary amine, such as triethylamine or methyldiethylamine; an alcohol amine, such as dimethylethanolamine or triethanolamine; a quaternary ammonium salt, such as tetramethylammonium hydroxide, tetraethylammonium hydroxide, or choline; or a cyclic amine, such as pyrrole or piperidine. Further, an alcohol, such as isopropyl alcohol, or a surfactant, such as a nonionic surfactant, may be added to the above-mentioned aqueous alkali solution in an appropriate amount before use. Of these, a preferred developer is a quaternary ammonium salt, and further preferred are tetramethylammonium hydroxide and choline. Further, for example, a surfactant may be added to the above developer. Instead of the method using an alkaline developer, a method, in which development is conducted using an organic solvent, such as butyl acetate, may be used so as to develop the portion of the photoresist, in which the alkali dissolution rate is not improved.

Then, using the formed resist pattern as a mask, the protective film is subjected to dry etching. In this instance, when the above-mentioned inorganic film is formed on the surface of the semiconductor substrate used, the surface of the inorganic film is exposed; and, when the inorganic film is not formed on the surface of the semiconductor substrate used, the surface of the semiconductor substrate is exposed.

Further, using the dry etched protective film (including the resist pattern in the case where the resist pattern remains on the protective film) as a mask, the resultant substrate is subjected to wet etching using a wet etching liquid for semiconductor, to form a desired pattern.

With respect to the wet etching liquid for semiconductor, a general chemical liquid for etching a wafer for semiconductor may be used, and, for example, any of a substance exhibiting acidic properties and a substance exhibiting basic properties may be used.

Examples of substances exhibiting acidic properties include hydrogen peroxide, hydrofluoric acid, ammonium fluoride, acidic ammonium fluoride, ammonium hydrogenfluoride, buffered hydrofluoric acid, hydrochloric acid, nitric acid, sulfuric acid, phosphoric acid, and a mixture thereof.

Examples of substances exhibiting basic properties include a basic aqueous hydrogen peroxide solution obtained by mixing ammonia, sodium hydroxide, potassium hydroxide, sodium cyanide, potassium cyanide, or an organic amine, such as triethanolamine, with an aqueous hydrogen peroxide solution so that the pH of the resultant solution becomes on the basic side. One specific example is SC-1 (ammonia-hydrogen peroxide solution). In addition, a chemical liquid usable for wet etching includes a mixture of an aqueous hydrogen peroxide solution and a substance capable of making the pH be on the basic side, for example, urea, such that the mixture is heated to allow urea to thermally decompose and generate ammonia, so that the pH of the resultant solution is eventually on the basic side.

Of these, preferred is an acidic aqueous hydrogen peroxide solution or a basic aqueous hydrogen peroxide solution.

These chemical liquids may contain an additive, such as a surfactant.

The temperature at which the wet etching liquid for semiconductor is used is desirably within the range of 25 to 90° C., further desirably 40 to 80° C. The wet etching time is desirably within the range of 0.5 to 30 minutes, further desirably 1 to 20 minutes.

EXAMPLES

Hereinbelow, the contents of the present invention will be described in detail with reference to the following Examples, which should not be construed as limiting the scope of the present invention.

The weight average molecular weight of the polymer shown in the following Synthesis Examples 1 to 4 in the present specification is the result of the measurement by gel permeation chromatography (hereinafter, referred to simply as "GPC"). In the measurement, a GPC apparatus, manufactured by Tosoh Corp., was used, and the conditions for the measurement and others are as follows.

GPC Column: Shodex KF803L, Shodex KF802, Shodex KF801 [registered trademark] (Showa Denko K.K.)
Column temperature: 40° C.
Solvent: Tetrahydrofuran (THF)
Flow rate: 1.0 ml/minute
Standard sample: Polystyrene (manufactured by Tosoh Corp.)

Synthesis Example 1

20.00 g of monoallyldiglycidyl isocyanurate (product name: MA-DGIC, manufactured by Shikoku Chemicals Corporation), 12.69 g of 3,3'-dithiodipropionic acid (trade name: DTDPA, manufactured by Sakai Chemical Industry Co. Ltd.), 4.22 g of gallic acid hydrate, and 1.81 g of tetrabutylphosphonium bromide as a catalyst were dissolved in 58.09 g of propylene glycol monomethyl ether, and then subjected to reaction at 105° C. for 24 hours, obtaining a solution containing a reaction product (solid content: 40% by mass). The obtained reaction product had a repeating unit and a terminal structure represented by formula (D-1). The GPC analysis of the obtained reaction product showed that the reaction product had a weight average molecular weight of 3,100, as determined using a conversion calibration curve obtained from the standard polystyrene.

[Chemical formula 22]

Formula (D-1)

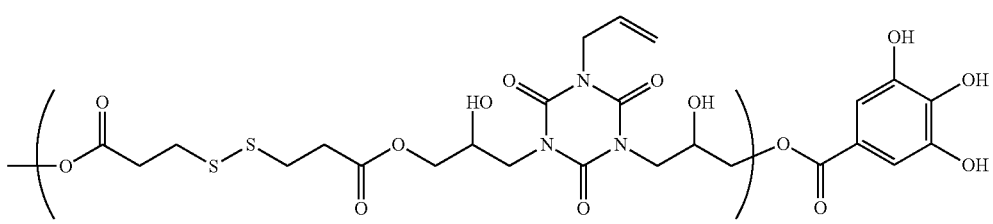

Synthesis Example 2

20.00 g of diglycidyl terephthalate (product name: EX-711, manufactured by Nagase Chemtex Corporation), 12.33 g of 3,3'-dithiodipropionic acid (trade name: DTDPA, manufactured by Sakai Chemical Industry Co. Ltd.), 4.11 g of gallic acid hydrate, and 1.76 g of tetrabutylphosphonium bromide as a catalyst were dissolved in 57.29 g of propylene glycol monomethyl ether, and then subjected to reaction at 105° C. for 24 hours, obtaining a solution containing a reaction product (solid content: 40% by mass). The obtained reaction product had a repeating unit and a terminal structure represented by formula (D-2). The GPC analysis of the obtained reaction product showed that the reaction product had a weight average molecular weight of 3,900, as determined using a conversion calibration curve obtained from the standard polystyrene.

[Chemical formula 23]

Formula (D-2)

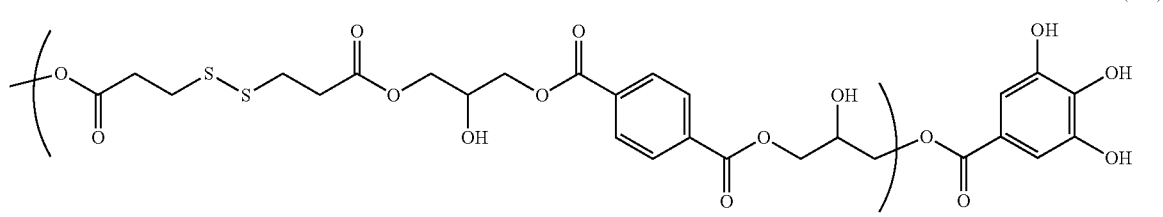

Synthesis Example 3

20.00 g of 1,3'-diglycidylhydantoin (manufactured by Shikoku Chemicals Corporation), 12.69 g of 3,3'-dithiodipropionic acid (trade name: DTDPA, manufactured by Sakai Chemical Industry Co. Ltd.), 4.23 g of gallic acid hydrate, and 1.81 g of tetrabutylphosphonium bromide as a catalyst were dissolved in 58.09 g of propylene glycol monomethyl ether, and then subjected to reaction at 105° C. for 24 hours, obtaining a solution containing a reaction product (solid content: 40% by mass). The obtained reaction product had a repeating unit and a terminal structure represented by formula (D-3). The GPC analysis of the obtained reaction product showed that the reaction product had a weight average molecular weight of 3,900, as determined using a conversion calibration curve obtained from the standard polystyrene.

[Chemical formula 24]

Formula (D-3)

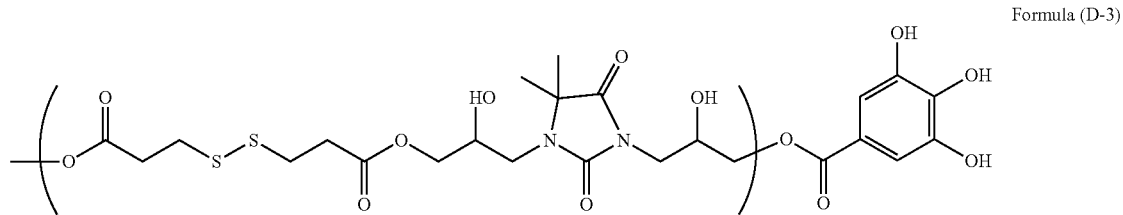

Synthesis Example 4

20.00 g of monoallyldiglycidyl isocyanurate (product name: MA-DGIC, manufactured by Shikoku Chemicals Corporation), 16.42 g of 3,3'-dithiodipropionic acid (trade name: DTDPA, manufactured by Sakai Chemical Industry Co. Ltd.), and 0.659 g of ethyltriphenylphosphonium bromide as a catalyst were dissolved in 92.71 g of propylene glycol monomethyl ether, and then subjected to reaction at 105° C. for 24 hours, obtaining a solution containing a reaction product (solid content: 20% by mass). The obtained reaction product had a repeating unit represented by formula (D-4). The GPC analysis of the obtained reaction product showed that the reaction product had a weight average molecular weight of 4,600, as determined using a conversion calibration curve obtained from the standard polystyrene.

[Chemical formula 25]

Formula (D-4)

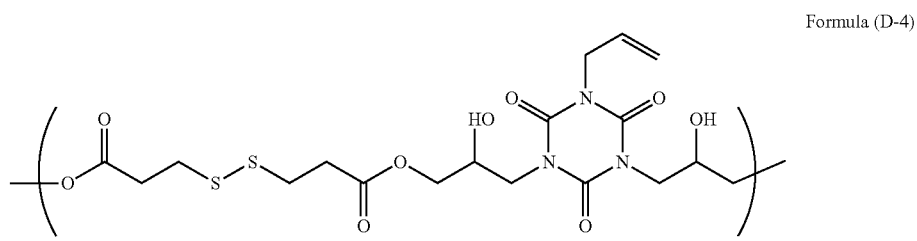

Hereinbelow, the present invention will be described in more detail with reference to the following Examples, which should not be construed as limiting the scope of the present invention. Further, the chemical liquid having the composition shown in Table 1 below was used as a basic aqueous hydrogen peroxide solution; however, the basic aqueous hydrogen peroxide solution used in the present invention is not limited to the one having the composition shown in Table 1.

Example 1

To 27.62 g of the solution containing the polymer obtained in Synthesis Example 1 were added 0.552 g of pyridinium trifluoromethanesulfonate, 18.84 g of propylene glycol monomethyl ether acetate, and 152.99 g of propylene glycol monomethyl ether to obtain a solution. The obtained solution was subjected to filtration using a polyethylene microfilter having a pore diameter of 0.02 μm to prepare a protective film-forming composition.

Example 2

To 27.62 g of the solution containing the polymer obtained in Synthesis Example 2 were added 0.552 g of pyridinium trifluoromethanesulfonate, 18.84 g of propylene glycol monomethyl ether acetate, and 152.99 g of propylene glycol monomethyl ether to obtain a solution. The obtained solution was subjected to filtration using a polyethylene microfilter having a pore diameter of 0.02 μm to prepare a protective film-forming composition.

Example 3

To 27.62 g of the solution containing the polymer obtained in Synthesis Example 3 were added 0.552 g of pyridinium trifluoromethanesulfonate, 18.84 g of propylene glycol monomethyl ether acetate, and 152.99 g of propylene glycol monomethyl ether to obtain a solution. The obtained solution was subjected to filtration using a polyethylene microfilter having a pore diameter of 0.02 μm to prepare a protective film-forming composition.

Example 4

To 27.62 g of the solution containing the polymer obtained in Synthesis Example 1 were added 0.552 g of pyridinium trifluoromethanesulfonate, 1.105 g of TMOM-BP (manufactured by Honshu Chemical Industry Co., Ltd.), 18.84 g of propylene glycol monomethyl ether acetate, and 152.99 g of propylene glycol monomethyl ether to obtain a solution. The obtained solution was subjected to filtration using a polyethylene microfilter having a pore diameter of 0.02 μm to prepare a protective film-forming composition.

Comparative Example 1

To 55.24 g of the solution containing the polymer obtained in Synthesis Example 4 were added 0.552 g of pyridinium trifluoromethanesulfonate, 18.84 g of propylene glycol monomethyl ether acetate, and 125.37 g of propylene glycol monomethyl ether to obtain a solution. The obtained solution was subjected to filtration using a polyethylene microfilter having a pore diameter of 0.02 μm to prepare a protective film-forming composition.

(Formation of a Film)

Each of the protective film-forming compositions prepared in Examples 1 to 3 and the film forming composition prepared in Comparative Example 1 was applied by spin coating onto a silicon substrate having a titanium nitride film formed on the surface thereof, and baked at 220° C. for 60 seconds to form a film having a thickness of 100 nm.

(Test for Resistance to a Basic Aqueous Hydrogen Peroxide Solution)

With respect to the films formed using the protective film-forming compositions prepared in Examples 1 to 3 and the film forming composition prepared in Comparative Example 1 on the silicon substrate having a titanium nitride film formed on the surface thereof, each of the films was immersed in a basic aqueous hydrogen peroxide solution having the composition shown in Table 1 below at the temperature shown in Table 1 for one minute, and then washed with water and dried, and then the state of the film was visually observed. The results are shown in Table 2 below. In Table 2, "○" indicates a state that no peeling was found in the film even after the treatment for one minute, and "X" indicates a state that peeling was observed in part of or all of the film after the treatment for one minute.

TABLE 1

Composition of basic aqueous hydrogen peroxide solution and treatment temperature

| 28 mass % Aqueous ammonia solution | 33 mass % Aqueous hydrogen peroxide solution | Water | Temperature |
|---|---|---|---|
| 25 mL | 100 mL | 500 mL | 70° C. |

TABLE 2

| | Results of test for resistance |
|---|---|
| Example 1 | ○ |
| Example 2 | ○ |
| Example 3 | ○ |
| Example 4 | ○ |
| Comparative Example 1 | X |

The results in Table 2 above show that the films formed using the protective film-forming compositions prepared in Examples 1 to 3 have a satisfactory resistance to a basic aqueous hydrogen peroxide solution. That is, it has been found that these films can be used as a protective film for a basic aqueous hydrogen peroxide solution. In contrast, the results show that the film formed using the film forming composition prepared in Comparative Example 1 does not have a resistance to a basic aqueous hydrogen peroxide solution, and it is apparent that this film cannot be used as a protective film for a basic aqueous hydrogen peroxide solution.

INDUSTRIAL APPLICABILITY

The protective film-forming composition of the present invention provides a protective film which has excellent resistance to a wet etching liquid used for processing of a substrate and further has high dry etching rate, facilitating processing of the substrate and exhibiting excellent planarization property when applied to a stepped substrate.

The invention claimed is:

1. A composition for forming a protective film against a wet etching liquid for semiconductor, comprising:
a reaction product (P) of a diepoxy compound (B) and a divalent or multivalent proton-generating compound (C), the reaction product (P) including a structure represented by the following formula (1):

  Formula (1)

wherein Ar represents an aryl group having 6 to 40 carbon atoms, n represents an integer of 3 to 10, —Y— represents —OCO—, —O—, or —S—, and * indicates a bonding site to a terminal of the molecule of reaction product (P), the molecule of the reaction product (P) having a unit structure represented by the following formula (2):

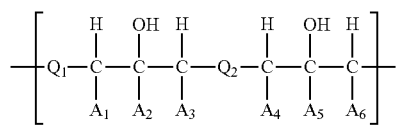  Formula (2)

wherein $Q_1$ and $Q_2$ represent a divalent organic group, and $A_1$ to $A_6$ represent a hydrogen atom, a methyl group, or an ethyl group; and further
an organic solvent (S).

2. The protective film-forming composition according to claim 1, wherein the divalent or multivalent proton-generating compound (C) has a functional group selected from a hydroxy group, a carboxyl group, a thiol group, an amino group, and an imide group.

3. The protective film-forming composition according to claim 1, wherein the divalent or multivalent proton-generating compound (C) is an acid dianhydride.

4. The protective film-forming composition according to claim 1, wherein $Q_1$ in formula (2) is represented by the following formula (3):

  Formula (3)

wherein $R_2$ represents a direct bond, an alkylene group having 1 to 10 carbon atoms and being optionally interrupted by —O—, —S—, or —S—S—, an alkenylene group having 2 to 6 carbon atoms, or a divalent organic group having at least one of an alicyclic hydrocarbon ring having 3 to 10 carbon atoms and an aromatic hydrocarbon ring having 6 to 14 carbon atoms, wherein the divalent organic group is optionally substituted with at least one group selected from the group consisting of an alkyl group having 1 to 6 carbon atoms, an alkenyl group having 2 to 6 carbon atoms, an alkynyl group having 2 to 6 carbon atoms, a halogen atom, a hydroxy group, a nitro group, a cyano group, a methylidene group, an alkoxy group having 1 to 6 carbon atoms, an alkoxycarbonyl group having 2 to 6 carbon atoms, and an alkylthio group having 1 to 6 carbon atoms, and each of $Z_1$ and $Z_1$ represents —COO—, —OCO—, —O—, or —S—.

5. The protective film-forming composition according to claim 1, wherein $Q_2$ in formula (2) is represented by the following formula (4):

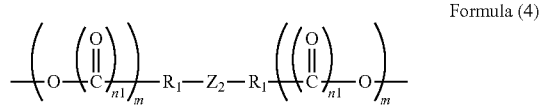  Formula (4)

wherein $R_1$ represents a direct bond or an alkylene group having 1 to 5 carbon atoms, n1 and m represent an integer of 0 or 1, and $Z_2$ is represented by the following formula (5), (6), or (7):

  Formula (5)

  Formula (6)

  Formula (7)

wherein, in formula (6), X is represented by the following formula (8), (9), or (10):

  Formula (8)

  Formula (9)

  Formula (10)

wherein each of $R_{11}$, $R_{12}$, $R_{13}$, $R_{14}$, and $R_{15}$ independently represents a hydrogen atom, an alkyl group having 1 to 6 carbon atoms, an alkenyl group having 3 to 6 carbon atoms, a benzyl group, or a phenyl group, wherein the phenyl group is optionally substituted with at least one member selected from the group consisting of an alkyl group having 1 to 6 carbon atoms, a halogen atom, a nitro group, a cyano group, an alkoxy group having 1 to 6 carbon atoms, and an alkylthio group having 1 to 6 carbon atoms, and $R_{13}$ and $R_{14}$ are optionally bonded together to form a ring having 3 to 6 carbon atoms.

6. The protective film-forming composition according to claim 1, wherein Ar includes a benzene, naphthalene, and anthracene structure.

7. The protective film-forming composition according to claim 1, wherein n is an integer of 3 to 4.

8. The protective film-forming composition according to claim 1, further comprising a crosslinking agent (K).

9. The protective film-forming composition according to claim 8, wherein the crosslinking agent (K) is a compound selected from a compound represented by the following formula (11) or (12):

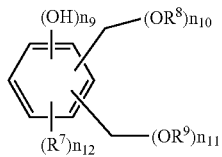
Formula (11)

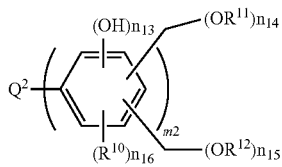
Formula (12)

wherein $Q^2$ represents a single bond or an m2-valent organic group, each of $R^8$, $R^9$, $R^{11}$, and $R^{12}$ represents a hydrogen atom or a methyl group, each of $R^7$ and $R^{10}$ represents an alkyl group having 1 to 10 carbon atoms or an aryl group having 6 to 40 carbon atoms, n9 represents an integer satisfying $1 \leq n9 \leq 3$, n10 represents an integer satisfying $2 \leq n10 \leq 5$, n11 represents an integer satisfying $0 \leq n11 \leq 3$, n12 represents an integer satisfying $0 \leq n12 \leq 3$, and the integers satisfy $3 \leq (n9+n10+n11+n12) \leq 6$, n13 represents an integer satisfying $1 \leq n13 \leq 3$, n14 represents an integer satisfying $1 \leq n14 \leq 4$, n15 represents an integer satisfying $0 \leq n15 \leq 3$, n16 represents an integer satisfying $0 \leq n16 \leq 3$, and the integers satisfy $2 \leq (n13+n14+n15+n16) \leq 5$, and m2 represents an integer of 2 to 10, a melamine compound,
a guanamine compound,
a glycoluril compound, and
an urea compound.

10. The protective film-forming composition according to claim 1, further comprising a crosslinking catalyst.

11. The protective film-forming composition according to claim 1, further comprising a surfactant.

12. A protective film, which is a baked product of an applied film comprising the protective film-forming composition according to claim 1.

13. A method for producing a substrate having a resist pattern, comprising the steps of:
applying the protective film-forming composition according to claim 1 onto a semiconductor substrate and baking the applied composition to form a protective film as a resist underlying film, and
forming a resist film on the protective film and then subjecting the resist film to exposure and development to form a resist pattern,
wherein the method is used in the production of a semiconductor.

14. A method for producing a semiconductor device, comprising the steps of:
forming a protective film on a semiconductor substrate optionally having an inorganic film formed on the surface thereof using the protective film-forming composition according to claim 1,
forming a resist pattern on the protective film,
subjecting the protective film to dry etching, with the formed resist pattern as a mask, so as to expose a surface of the inorganic film or the semiconductor substrate, and,
with the dry-etched protective film as a mask, subjecting the inorganic film or the semiconductor substrate to wet etching with a wet etching liquid for semiconductor followed by washing.

* * * * *